United States Patent
Ramakrishnan et al.

(10) Patent No.: US 7,319,272 B2
(45) Date of Patent: Jan. 15, 2008

(54) BALL ASSIGNMENT SYSTEM

(75) Inventors: Arun Ramakrishnan, Tustin, CA (US); Farshad Ghahghahi, Los Gatos, CA (US); Aritharan Thurairajaratnam, San Jose, CA (US); Leah M. Miller, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 328 days.

(21) Appl. No.: 11/097,895

(22) Filed: Apr. 1, 2005

(65) Prior Publication Data

US 2006/0223341 A1    Oct. 5, 2006

(51) Int. Cl.
   *H01L 23/48*    (2006.01)
   *H01L 23/52*    (2006.01)
   *H01L 29/40*    (2006.01)
   *H01L 23/34*    (2006.01)

(52) U.S. Cl. .................. 257/773; 257/786; 257/728; 257/E23.07

(58) Field of Classification Search ............. 257/773, 257/786, 698, 728, 690, E23.07
See application file for complete search history.

(56) References Cited

U.S. PATENT DOCUMENTS 5,686,764 A * 11/1997 Fulcher ............... 257/778
5,952,726 A * 9/1999 Liang ................. 257/778
6,433,441 B1 * 8/2002 Niwa et al. ............ 257/784

\* cited by examiner

*Primary Examiner*—Nitin Parekh
(74) *Attorney, Agent, or Firm*—Luedeka, Neely & Graham, P.C.

(57) ABSTRACT

A pattern of contacts that includes high speed transmitter contacts disposed in a first portion of the pattern, where the high speed transmitter contacts are disposed in transmitter differential pairs. High speed receiver contacts are disposed in a second portion of the pattern, where the first portion of the pattern is not interspersed with the second portion of the pattern, and the high speed receiver contacts are disposed in receiver differential pairs. At least one unbroken line of other contacts is disposed between the first portion of the pattern and the second portion of the pattern, where the other contacts do not contain any high speed transmitter contacts and high speed receiver contacts. Low speed IO contacts are disposed in a third portion of the pattern, where the third portion of the pattern is disposed in an interior portion of the pattern relative to both the first portion of the pattern and the second portion of the pattern. Substantially all of the contacts are disposed at a standard pitch one from another on a single contact surface.

20 Claims, 4 Drawing Sheets

BALL ASSIGNMENT SYSTEM

FIELD

This invention relates to the field of integrated circuit fabrication. More particularly, this invention relates to ball grid array layout for integrated circuit packages.

BACKGROUND

Integrated circuits are operating at ever increasing speeds. For example, integrated circuits for markets such as communication and storage are often embedded with multiple cores that send and receive signals at speeds greater than about two and one-half gigabits per second, which is defined herein to be a high speed signal or a high speed device.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar.

Integrated circuits are typically formed into packaged devices with a package substrate. The package substrate provides all of the electrical connections to the integrated circuit, and provides separate electrical connections to another structure, typically referred to as the printed circuit board. Thus, as the terms are used herein, there are three different structure types used in an electrical circuit, which structures are the integrated circuit, the printed circuit board, and the interface between the integrated circuit and the printed circuit board, which is the package substrate. As contemplated herein, the integrated circuit does not at any time physically contact the printed circuit board, and the printed circuit board and the package substrate are physically separate elements that are manufactured at different times and using different processes.

The distinction between the printed circuit board and the package substrate is further exemplified by the time at which they are electrically connected to the integrated circuit. The package substrate is considered to be a part of the packaged integrated circuit, and the integrated circuit is typically not shipped from the integrated circuit manufacturer until it is assembled as a packaged device with the package substrate. However, the packaged substrate is typically assembled with the printed circuit board in a different facility at a later time by a purchaser of the packed integrated circuit. Thus, one skilled in the art is able to quickly distinguish between a printed circuit board and a package substrate.

For high speed integrated circuits, isolation within the transmitter and receiver pairs of the high speed signals and between the high speed signals and the other signals in the integrated circuit, package substrate, and printed circuit board are becoming a critical factor for ensuring the proper performance of the system. As a result, package designers strive to route integrated circuits so that the high speed signals are adequately isolated in the package substrate, and at the same time the package substrate design allows for adequate isolation in the printed circuit board. In addition, the package substrate design preferably enables routing of the high speed signals in the lowest possible number of printed circuit board layers, since this is a direct contributor to the overall cost of the system.

What is needed, therefore, is a system of routing high speed signals in a manner that overcomes problems and achieves goals, such as those described above, at least in part.

SUMMARY

The above and other needs are met by a pattern of contacts that includes high speed transmitter contacts disposed in a first portion of the pattern, where the high speed transmitter contacts are disposed in transmitter differential pairs. High speed receiver contacts are disposed in a second portion of the pattern, where the first portion of the pattern is not interspersed with the second portion of the pattern, and the high speed receiver contacts are disposed in receiver differential pairs. At least one unbroken line of other contacts is disposed between the first portion of the pattern and the second portion of the pattern, where the other contacts do not contain any high speed transmitter contacts and high speed receiver contacts. Low speed IO contacts are disposed in a third portion of the pattern, where the third portion of the pattern is disposed in an interior portion of the pattern relative to both the first portion of the pattern and the second portion of the pattern. Substantially all of the contacts are disposed at a standard pitch one from another on a single contact surface.

By configuring the contact pattern in this manner, better separation between the high speed transmitter contacts and the high speed receiver contacts is achieved, and the high speed signals are more easily routed out of the pattern, thus enabling routing of the high speed transmitter signals and the high speed receiver signals to be accomplished on only a single layer each in many embodiments.

In various embodiments, the other contacts are at least one of VSS contacts and VDD contacts. Adjacent sets of the transmitter differential pairs are preferably offset one from another by at least one contact position. Similarly, adjacent sets of the receiver differential pairs are preferably also offset one from another by at least one contact position. Preferably; transmitter via lands are electrically connected to the high speed transmitter contacts, where only one each of the transmitter via lands is electrically connected to only one each of the high speed transmitter contacts, and the transmitter via lands for two adjacent sets of transmitter differential pairs are disposed one from another at a distance of at least about the standard pitch times the square root of two. Similarly, receiver via lands are preferably electrically connected to the high speed receiver contacts, where only one each of the receiver via lands is electrically connected to only one each of the high speed receiver contacts, and the receiver via lands for two adjacent sets of receiver differential pairs are disposed one from another at a distance of at least about the standard pitch times the square root of two.

In one embodiment, transmitter via lands electrically connect the high speed transmitter contacts on the contact surface (as depicted in FIG. 1) to transmitter leads on only one transmitter routing surface (as depicted in FIG. 4), where two each of the transmitter leads are routed out of the pattern between adjacent lines of transmitter via lands. In a similar embodiment, receiver via lands electrically connect the high speed receiver contacts on the contact surface to receiver leads on only one receiver routing surface (as depicted in FIG. 3), where two each of the receiver leads are routed out of the pattern between adjacent lines of receiver via lands.

In an alternate embodiment, transmitter via lands electrically connect the high speed transmitter contacts on the contact surface (as depicted in FIG. 1) to transmitter leads on only two transmitter routing surfaces (one of which as depicted in FIG. 4), where only one each of the transmitter leads are routed out of the pattern between adjacent lines of transmitter via lands. In a similar alternate embodiment, receiver via lands electrically connecting the high speed receiver contacts on the contact surface to receiver leads on only two receiver routing surfaces (one of which as depicted in FIG. 3), where only one each of the receiver leads are routed out of the pattern between adjacent lines of receiver via lands.

Also described are contact patterns such as those described above that are implemented in printed circuit boards and package substrates.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
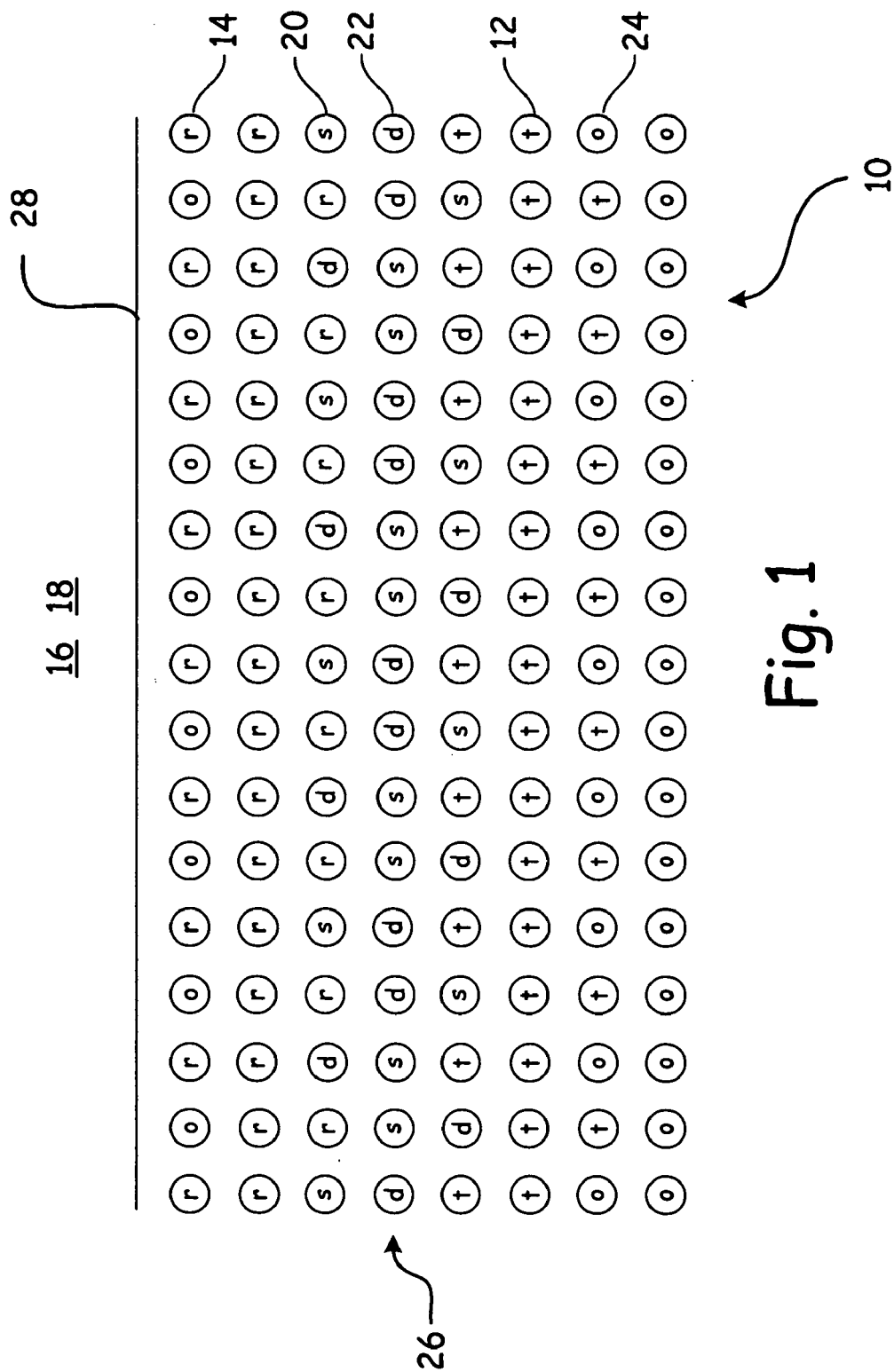
FIG. 1 is a contact placement pattern for transmitter and receiver pairs between a package substrate and a printed circuit board, according to a preferred embodiment of the invention.

With reference now to FIG. 1, there is depicted a contact placement pattern 10 for transmitter contacts 12 and receiver contacts 14 between a package substrate 16 and a printed circuit board 18, according to a preferred embodiment of the invention. As depicted in FIG. 1, the view is looking down on a portion of the contacts as they appear on either the package substrate 16 or the printed circuit board 18. Depending upon which of the package substrate 16 or the printed circuit board 18 is being viewed, it is appreciated that the contact placement pattern 10 for the other would be the mirror image of that depicted. The patterns described herein are particularly applicable to full area array and peripheral area array flip chip and wire bond packaging technologies.

As can be seen in FIG. 1, one of the design elements of the pattern 10 is that all of the transmitter contacts 12 are separated from all of the receiver contacts 14 by an unbroken line 26 of VSS contacts 20 and VDD contacts 22. It is appreciated that the unbroken line 26 could be of just VSS contacts 20 or just VDD contacts 22, or more than one unbroken line 26 of either or both of the VSS contacts 20 and VDD contacts 22. However, in the preferred embodiment, there is just a single unbroken line 26 of both VSS contacts 20 and VDD contacts 22. The unbroken line 26 provides electrical isolation between the transmitter contacts 12 and the receiver contacts 14, which are preferably contacts for high speed signals, as defined elsewhere herein.

As depicted in FIG. 1, the receiver contacts 14 are disposed outside of the unbroken line 26, which means that they are disposed closer to the edge 28 of the package substrate 16 than the unbroken line 26 of contacts. Conversely, as depicted in FIG. 1, the transmitter contacts 12 are disposed inside of the unbroken line 26, which means that they are disposed farther from the edge 28 of the package substrate 16 than the unbroken line 26 of contacts. However, in other embodiments these positions of the receiver contacts 14 and the transmitter contacts 12 with respect to the unbroken line 26 are reversed.

The VDD contacts 22 and the VSS contacts 20 may be interspersed with the transmitter contacts 12 and the receiver contacts 14 on either side of the unbroken line 26. Other IO contacts 24, such as for signals that are not high speed signals, are also preferably provided in the pattern 10. Although some of these other IO contacts 24 may be disposed outside of the unbroken line 26, they are preferably disposed so as to be substantially grouped interior to whichever of the transmitter contacts 12 and the receiver contacts 14 that are disposed inside of the unbroken line 26. In addition, the transmitter contacts 12 and the receiver contacts 14 are preferably each grouped into differential pairs, as understood in the art. Each contact of a differential pair, whether it be a transmitter contact 12 differential pair or a receiver contact 14 differential pair, is preferably offset one from another by at least one contact.

Figure 2:
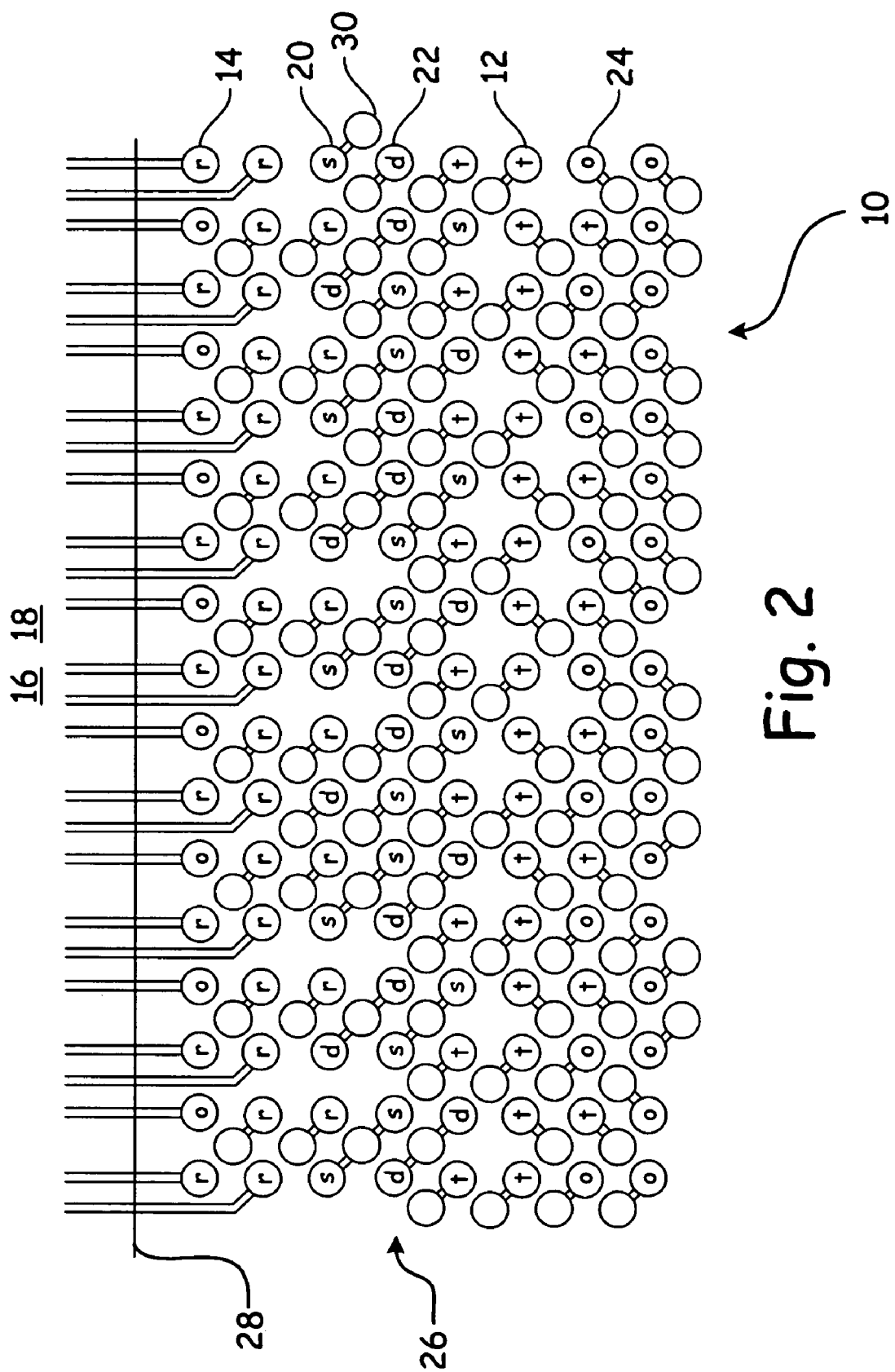
FIG. 2 is a via placement pattern for a printed circuit board that uses the contact placement pattern of FIG. 1, according to a preferred embodiment of the invention.

With this pattern 10, although the contacts 12 or 14 for adjacent differential pairs of contacts are disposed adjacent one another, the via lands 30 for these adjacent differential pairs are disposed apart from one another at a distance of $2^{1/2}$ times the distance between the contacts, as depicted in FIG. 2. Thus, if the contacts are disposed at one millimeter, one from another, then the via lands 30 are disposed at about 1.414 millimeters, one from another. This tends to enhance the isolation between different adjacent differential pairs.

By placing the high speed transmitter contacts 12 and high speed receiver contacts 14 generally closer to the edge 28 of the package substrate 16 than the bulk of the other IO contacts 24, the routing of these contacts in the printed circuit board 18 is generally more easily accomplished, as outer contacts are more easily routed than inner contacts. This generally enables the high speed contacts 12 and 14 to be routed on fewer layers than other patterns might permit. Most preferably, all of the high speed receiver contacts 14 are routed on a single first layer 34 of the printed circuit board 18, and all of the high speed transmitter contacts 12 are routed on a single second layer 36 of the printed circuit board 18, which second layer 36 is a different layer from the first layer 34, as depicted in FIGS. 3 and 4.

Figure 3:
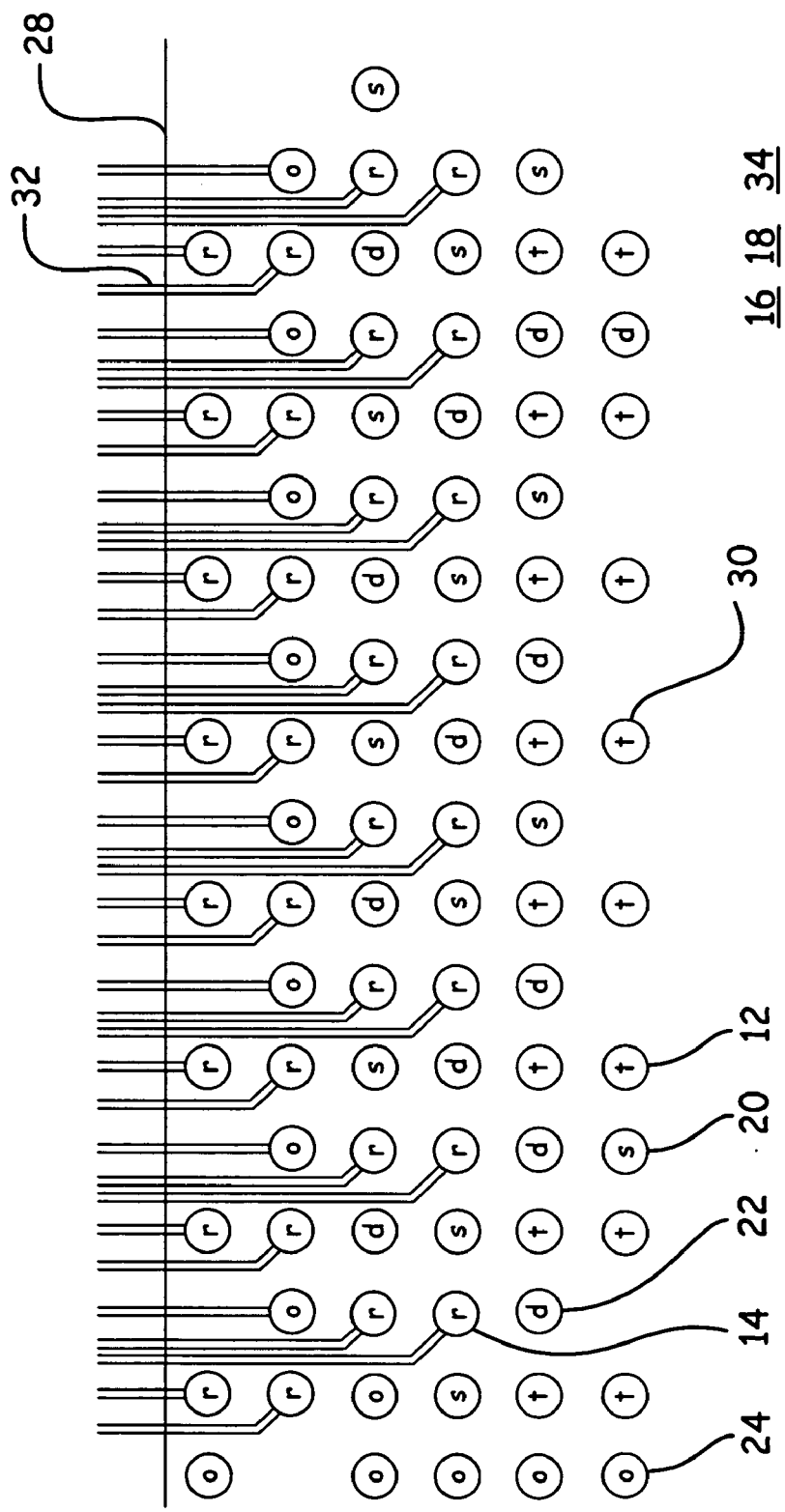
FIG. 3 is a receiver routing line placement pattern for a first layer of the printed circuit board of FIG. 2, according to a preferred embodiment of the invention.
Figure 4:
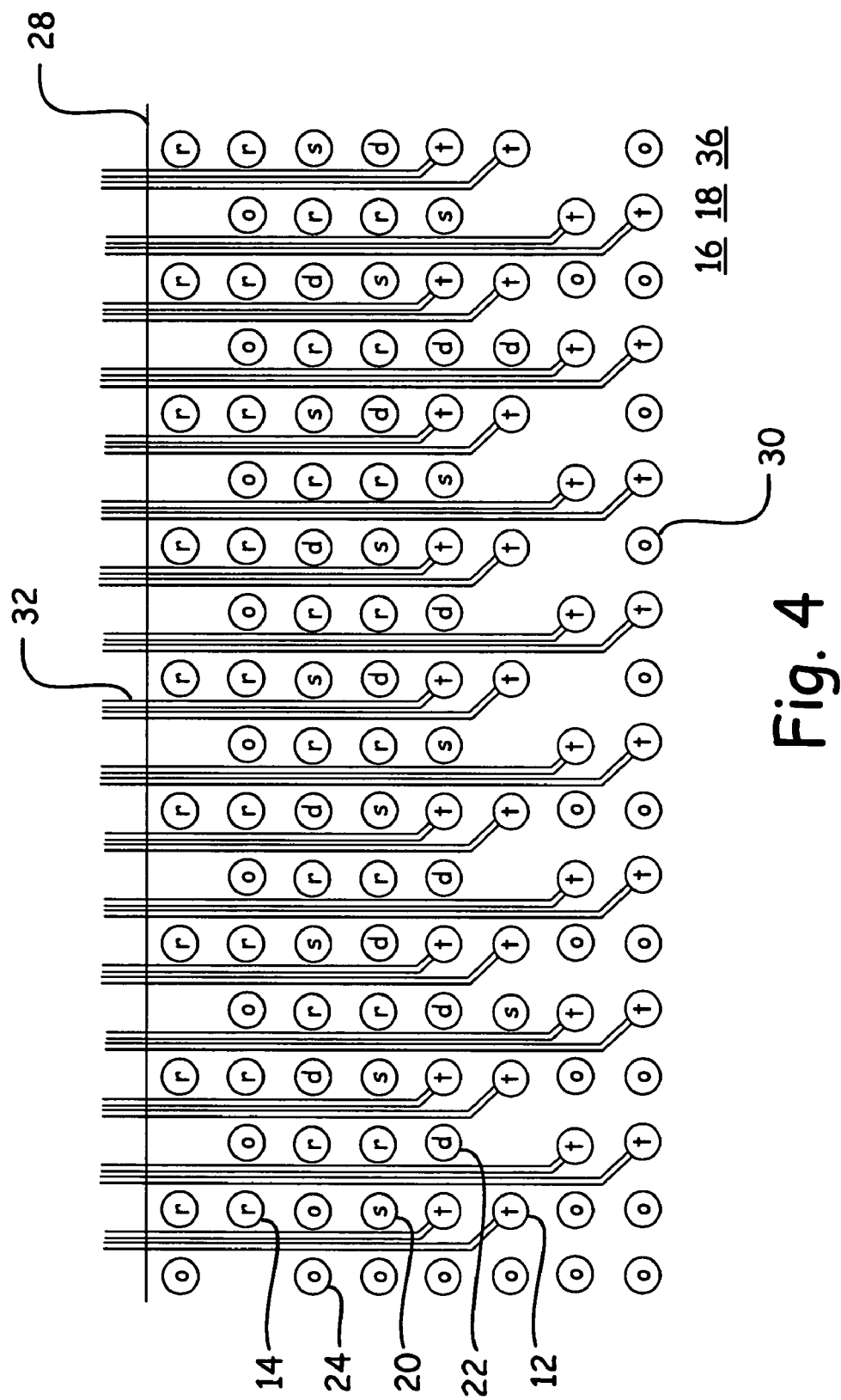
FIG. 4 is a transmitter routing line placement pattern for a second layer of the printed circuit board of FIG. 2, according to a preferred embodiment of the invention.

As depicted in FIG. 3, all the high speed receiver signals are preferably routed on a single layer 34 in the printed circuit board 18 when two lines 32 can be routed between two adjacent via lands 30 at a one millimeter pitch. Similarly, all the high speed transmitter signals are preferably routed on a single and separate second layer 36, as depicted in FIG. 4, when two lines 32 can be routed between two adjacent via lands 30 at a one millimeter pitch. Routing the high speed receiver and transmitter signals may require two separate layers each if the pitch between the via lands 30 only accommodates the routing of a single line 32.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A pattern of contacts comprising:
    high speed transmitter contacts disposed in a first portion of the pattern, where the high speed transmitter contacts are disposed in transmitter differential pairs,
    high speed receiver contacts disposed in a second portion of the pattern, where the first portion of the pattern is not interspersed with the second portion of the pattern, and the high speed receiver contacts are disposed in receiver differential pairs,
    at least one unbroken line of other contacts disposed between the first portion of the pattern and the second portion of the pattern, where the other contacts do not contain any high speed transmitter contacts and high speed receiver contacts, and
    low speed IO contacts disposed in a third portion of the pattern, where a part of the third portion of the pattern is disposed in an interior portion of the pattern relative to both the first portion of the pattern and the second portion of the pattern,
    where substantially all of the contacts are disposed at a first pitch one from another on a single contact surface.

2. The pattern of claim 1, wherein the other contacts comprise at least one of VSS contacts and VDD contacts.

3. The pattern of claim 1, wherein adjacent sets of the transmitter differential pairs are offset one from another by at least one contact position.

4. The pattern of claim 1, wherein adjacent sets of the receiver differential pairs are offset one from another by at least one contact position.

5. The pattern of claim 1, further comprising transmitter via lands electrically connected to the high speed transmitter contacts, where only one each of the transmitter via lands is electrically connected to only one each of the high speed transmitter contacts, and the transmitter via lands for two adjacent sets of transmitter differential pairs are disposed one from another at a distance of at least about the first pitch times the square root of two.

6. The pattern of claim 1, further comprising receiver via lands electrically connected to the high speed receiver contacts, where only one each of the receiver via lands is electrically connected to only one each of the high speed receiver contacts, and the receiver via lands for two adjacent sets of receiver differential pairs are disposed one from another at a distance of at least about the first pitch times the square root of two.

7. The pattern of claim 1, further comprising transmitter via lands electrically connecting the high speed transmitter contacts on the contact surface to transmitter leads on only one transmitter routing surface, where two each of the transmitter leads are routed out of the pattern between adjacent lines of transmitter via lands.

8. The pattern of claim 1, further comprising receiver via lands electrically connecting the high speed receiver contacts on the contact surface to receiver leads on only one receiver routing surface, where two each of the receiver leads are routed out of the pattern between adjacent lines of receiver via lands.

9. The pattern of claim 1, further comprising transmitter via lands electrically connecting the high speed transmitter contacts on the contact surface to transmitter leads on only two transmitter routing surfaces, where only one each of the transmitter leads are routed out of the pattern between adjacent lines of transmitter via lands.

10. The pattern of claim 1, further comprising receiver via lands electrically connecting the high speed receiver contacts on the contact surface to receiver leads on only two receiver routing surfaces, where only one each of the receiver leads are routed out of the pattern between adjacent lines of receiver via lands.

11. A printed circuit board having a pattern of contacts comprising:
    high speed transmitter contacts disposed in a first portion of the pattern, where the high speed transmitter contacts are disposed in transmitter differential pairs,
    high speed receiver contacts disposed in a second portion of the pattern, where the first portion of the pattern is not interspersed with the second portion of the pattern, and the high speed receiver contacts are disposed in receiver differential pairs,
    at least one unbroken line of other contacts disposed between the first portion of the pattern and the second portion of the pattern, where the other contacts do not contain any high speed transmitter contacts and high speed receiver contacts, and
    low speed IO contacts disposed in a third portion of the pattern, where a part of the third portion of the pattern is disposed in an interior portion of the pattern relative to both the first portion of the pattern and the second portion of the pattern,
    where substantially all of the contacts are disposed at a first pitch one from another on a single contact surface.

12. The printed circuit board of claim 11, wherein the other contacts comprise at least one of VSS contacts and VDD contacts.

13. The printed circuit board of claim 11, wherein:
    adjacent sets of the transmitter differential pairs are offset one from another by at least one contact position, and
    adjacent sets of the receiver differential pairs are offset one from another by at least one contact position.

14. The printed circuit board of claim 11, further comprising:
    transmitter via lands electrically connected to the high speed transmitter contacts, where only one each of the transmitter via lands is electrically connected to only one each of the high speed transmitter contacts, and the transmitter via lands for two adjacent sets of transmitter differential pairs are disposed one from another at a distance of at least about the first pitch times the square root of two, and
    receiver via lands electrically connected to the high speed receiver contacts, where only one each of the receiver via lands is electrically connected to only one each of the high speed receiver contacts, and the receiver via lands for two adjacent sets of receiver differential pairs are disposed one from another at a distance of at least about the first pitch times the square root of two.

15. The printed circuit board of claim 11, further comprising:
    transmitter via lands electrically connecting the high speed transmitter contacts on the contact surface to transmitter leads on only one transmitter routing surface, where two each of the transmitter leads are routed out of the pattern between adjacent lines of transmitter via lands, and receiver via lands electrically connecting the high speed receiver contacts on the contact surface to receiver leads on only one receiver routing surface, where two each of the receiver leads are routed out of the pattern between adjacent lines of receiver via lands.

16. The printed circuit board of claim 11, further comprising:
transmitter via lands electrically connecting the high speed transmitter contacts on the contact surface to transmitter leads on only two transmitter routing surfaces, where only one each of the transmitter leads are routed out of the pattern between adjacent lines of transmitter via lands, and
receiver via lands electrically connecting the high speed receiver contacts on the contact surface to receiver leads on only two receiver routing surfaces, where only one each of the receiver leads are routed out of the pattern between adjacent lines of receiver via lands.

17. A package substrate having a pattern of contacts comprising:
high speed transmitter contacts disposed in a first portion of the pattern, where the high speed transmitter contacts are disposed in transmitter differential pairs,
high speed receiver contacts disposed in a second portion of the pattern, where the first portion of the pattern is not interspersed with the second portion of the pattern, and the high speed receiver contacts are disposed in receiver differential pairs,
at least one unbroken line of other contacts disposed between the first portion of the pattern and the second portion of the pattern, where the other contacts do not contain any high speed transmitter contacts and high speed receiver contacts, and
low speed IO contacts disposed in a third portion of the pattern, where a part of the third portion of the pattern is disposed in an interior portion of the pattern relative to both the first portion of the pattern and the second portion of the pattern,
where substantially all of the contacts are disposed at a first pitch one from another on a single contact surface.

18. The package substrate of claim 17, wherein the other contacts comprise at least one of VSS contacts and VDD contacts.

19. The package substrate of claim 17, wherein:
adjacent sets of the transmitter differential pairs are offset one from another by at least one contact position, and
adjacent sets of the receiver differential pairs are offset one from another by at least one contact position.

20. The package substrate of claim 17, further comprising:
transmitter via lands electrically connected to the high speed transmitter contacts, where only one each of the transmitter via lands is electrically connected to only one each of the high speed transmitter contacts, and the transmitter via lands for two adjacent sets of transmitter differential pairs are disposed one from another at a distance of at least about the first pitch times the square root of two, and
receiver via lands electrically connected to the high speed receiver contacts, where only one each of the receiver via lands is electrically connected to only one each of the high speed receiver contacts, and the receiver via lands for two adjacent sets of receiver differential pairs are disposed one from another at a distance of at least about the first pitch times the square root of two.

* * * * *